United States Patent [19]

Takahashi et al.

[11] 4,292,116

[45] Sep. 29, 1981

[54] APPARATUS FOR MOUNTING CHIP TYPE CIRCUIT ELEMENTS ON A PRINTED CIRCUIT BOARD

[75] Inventors: Tetsuo Takahashi; Yoshinobu Taguchi; Shuichi Tando; Kenichi Saito, all of Tokyo, Japan

[73] Assignee: Tokyo Denki Kagaku Kogyo Kabushiki Kaisha, Japan

[21] Appl. No.: 28,924

[22] Filed: Apr. 10, 1979

[30] Foreign Application Priority Data

| Apr. 18, 1978 | [JP] | Japan | 53/50219[U] |
| Apr. 18, 1978 | [JP] | Japan | 53/50220[U] |
| Apr. 25, 1978 | [JP] | Japan | 53/54816[U] |
| Apr. 25, 1978 | [JP] | Japan | 53/54817[U] |
| Aug. 30, 1978 | [JP] | Japan | 53/118748[U] |
| Nov. 22, 1978 | [JP] | Japan | 53/160112[U] |

[51] Int. Cl.³ .................. B65G 59/04; B65H 3/44; H01L 21/98
[52] U.S. Cl. .................. 156/566; 29/740; 29/743; 29/757; 29/809; 156/285; 156/297; 156/564; 156/572; 221/93; 221/94; 221/211; 414/60; 414/121
[58] Field of Search .......... 29/569 R, 740, 747, 29/577 R, 577 C, 741, 743, 757, 809; 156/285, 207, 497, 560-565, 572, 297, 299, 566; 221/211, 93, 94, 209, 310; 269/21; 214/627, 8.5 R, 8.5 A, 8.5 C, 8.5 D, 650 SG

[56] References Cited

U.S. PATENT DOCUMENTS

| 3,009,560 | 11/1961 | Frazier | 221/211 X |
| 3,155,272 | 11/1964 | Kelley | 221/211 X |
| 3,479,716 | 11/1969 | Zanger et al. | 221/211 X |
| 3,757,995 | 9/1973 | Armstrong | 221/211 |
| 3,992,245 | 11/1976 | Franklin | 221/211 X |
| 4,127,432 | 11/1978 | Kuwano et al. | 156/562 X |

*Primary Examiner*—Bruce H. Hess
*Attorney, Agent, or Firm*—Steinberg & Raskin

[57] ABSTRACT

A method whereby chip type circuit elements are mounted at predetermined locations on a printed circuit board by a suction means and apparatus for performing the method are disclosed. The suction means picks up each circuit element from a respective stack supported in a vertical magazine and transfers and positions them above the predetermined locations on the printed circuit board which can have a predetermined pattern of laminar conductors on the upper surface thereof. The circuit elements are then released by termination of the applied suction and adhered to the board by a thermoplastic adhesive setting operation.

15 Claims, 32 Drawing Figures

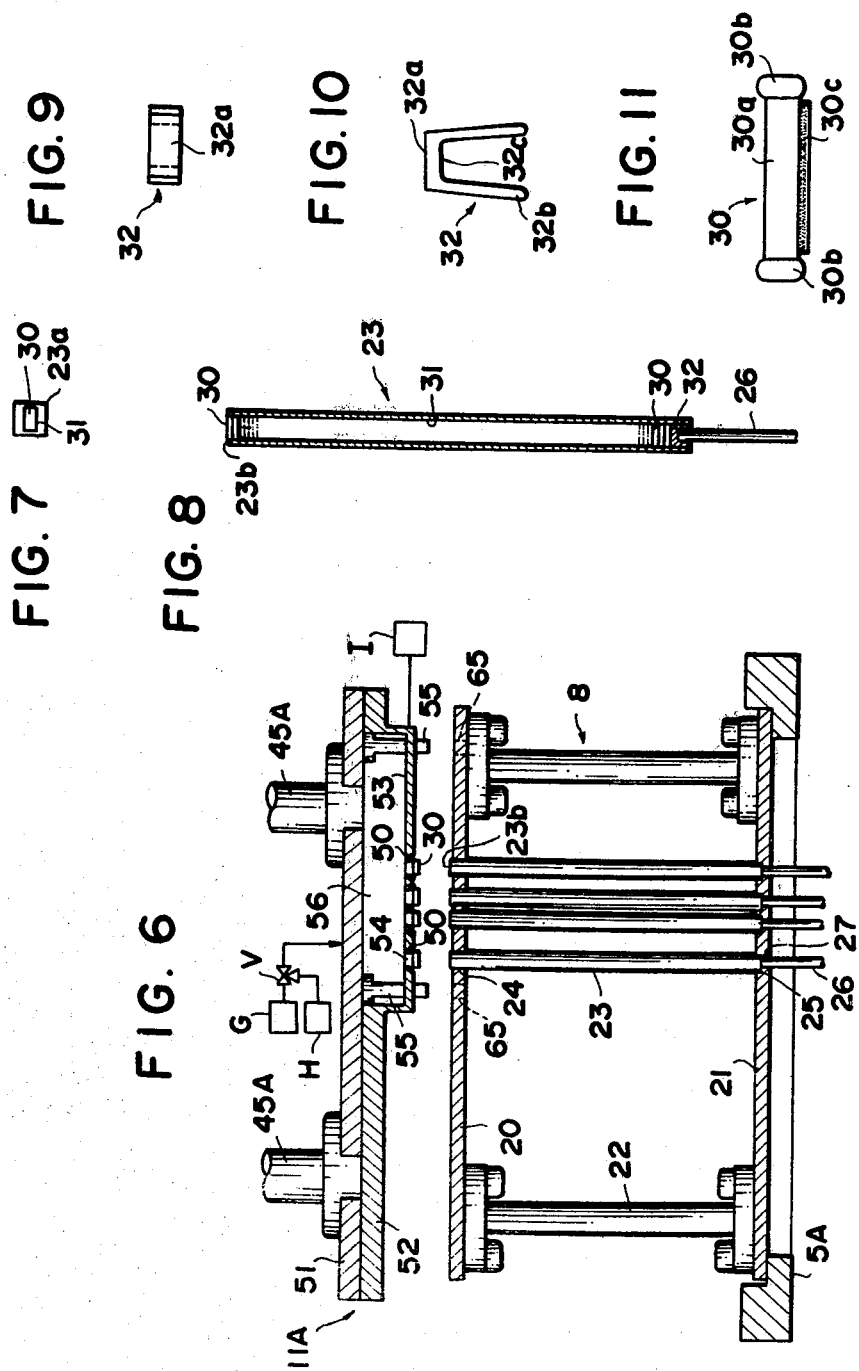

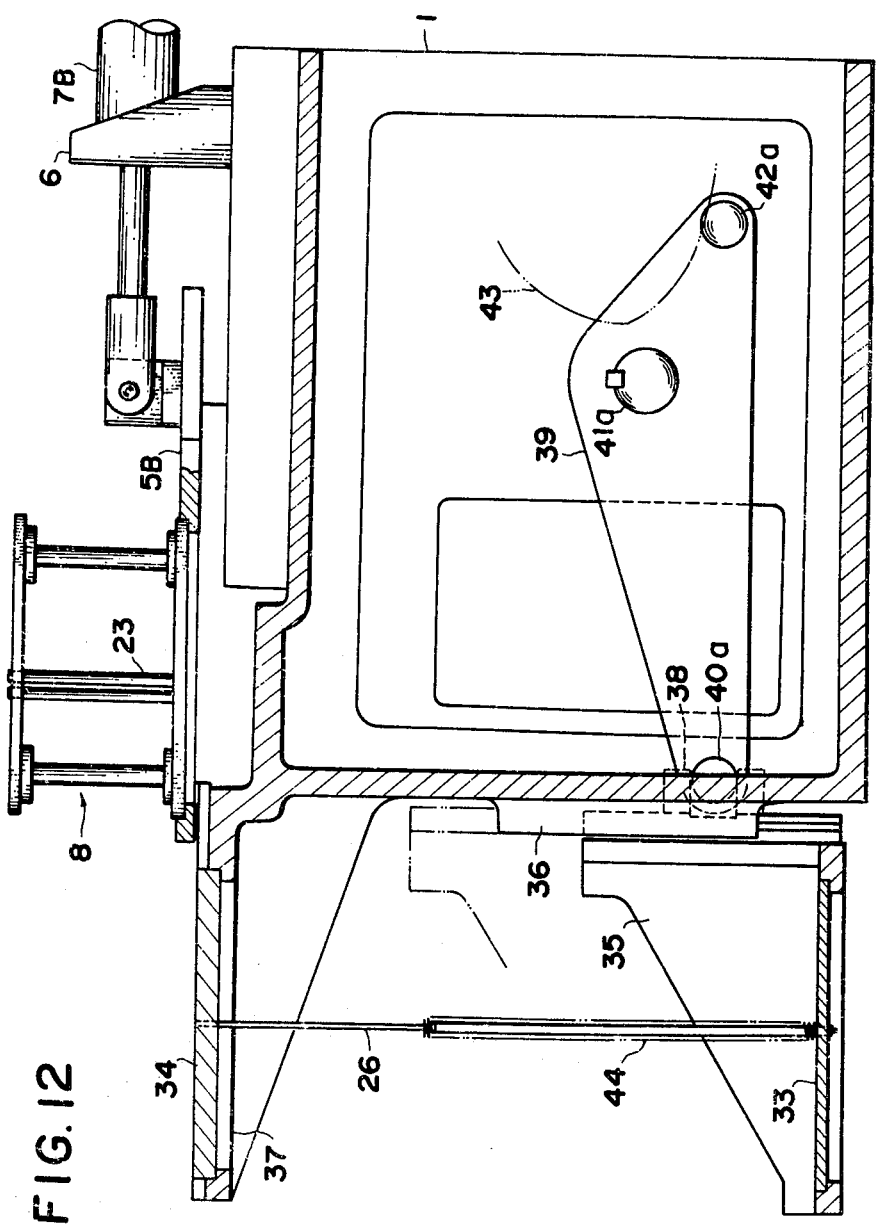

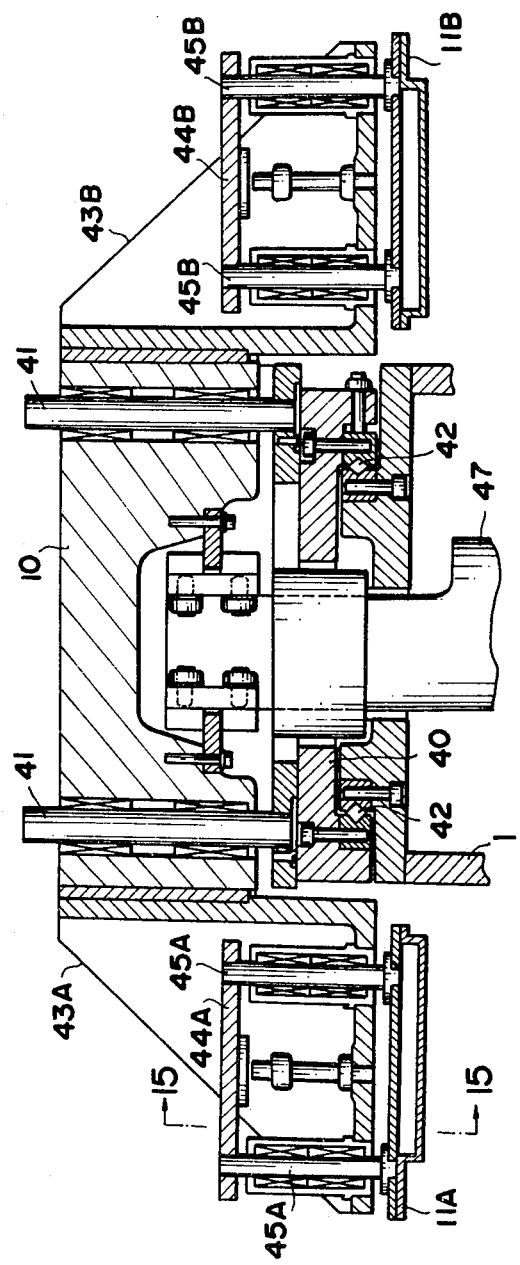

APPARATUS FOR MOUNTING CHIP TYPE CIRCUIT ELEMENTS ON A PRINTED CIRCUIT BOARD

BACKGROUND OF THE INVENTION

This invention relates to a method for mounting clip type circuit elements on a printed circuit board and an apparatus for performing the same.

More particularly, this invention relates to an improvement in the method and apparatus for mounting chip type elements on a printed circuit board, as disclosed in the specification of U.S. Pat. No. 4,127,432, in which the chip type circuit elements are mounted on a printed circuit board at predetermined positions by pushing up each circuit element stack inserted in a magazine which is vertically held and is inserted through a corresponding step-hole defined by a lattice-shaped and horizontally placed magazine guide.

The method disclosed in the specification of U.S. Pat. No. 4,127,432 is advantageous over the conventional method of using an NC (numerical control) apparatus in that chip type circuit elements can be mounted on a printed circuit board at a higher speed by using inexpensive and simple apparatus. An electronic circuit assembled according to this method, however, is susceptible to such serious defects as imprecise positioning of the chip type circuit elements on the printed circuit board during attachment, occurrence of open or high resistance points in the circuit due to improper mounting and resulting substantial decreases in the yield of the product.

These defects involved in the technique disclosed in the specification of U.S. Pat. No. 4,127,432 are due to the following structural features:

(1) Chip type circuit elements stacked in hollow tubular magazines are directly pressed against an adhesively treated printed circuit board by several dozens of respective thrust pins to mount the elements on the printed circuit board.

(2) In order to mount the chip type circuit elements, which are stacked in hollow tubular magazines, on the printed circuit board, the printed circuit board, inorder to confront said magazines, is arranged so that the surface against which the connectors for the circuit elements abut is directed downwardly.

In connection with the defect-causing structural feature (1), it is very difficult to press chip type circuit elements stacked in different heights in the respective magazines onto the adhesive layer formed on the printed circuit board under a uniform pressure by several dozens of the thrust pins. Although a compression spring is provided to adjust the pressing force of the thrust pins, the fatigue of the compression sprin is extreme at a high speed operation and the printed board is likely to lose its flatness and become warped. If such printed circuit boards are employed, it is very difficult to maintain a predetermined space between the top ends of the magazines, that is, the top ends of the thrust pins, and the mounting surface of each printed circuit board. Moreover, the adhesive applied to the printed circuit board is likely to adhere to the top ends of the thrust pins, resulting in occurrence of serious problems.

When the structural feature (2) is adopted, the adhesive layer is naturally formed on the bottom major surface of the printed circuit board until they are introduced into a subsequent soldering step. As a result, change of position or separation of the elements frequently occurs. More specifically, the printed circuit board having the circuit elements temporarily supported on the bottom surface thereof by means of the adhesive is delivered by belt means and the adhesive, which is thermosetting, is cured to fix the circuit elements to the printed circuit board. For effecting curing of the adhesive, the printed circuit board is inverted. During the delivering and inversion steps, the circuit elements temporarily held to the bottom surface of the printed circuit board are likely to deviate from their predetermined positions or separate from the printed circuit board.

SUMMARY OF THE INVENTION

It is therefore a primary object of the present invention to provide a method and apparatus for mounting chip type circuit elements on a printed circuit board, in which the above-mentioned problematical defects involved in the conventional technique disclosed in the specification of U.S. Pat. No. 4,127,432 are eliminated and the mounting operation can be performed safely and with very mounting precision.

In accordance with the present invention, this object can be attained by providing a method for mounting chip type circuit elements on a printed circuit board, which comprises:

vertically arranging a plurality of tubular magazines at predetermined relative positions corresponding to the positions of said circuit elements to be mounted on said printed circuit board, each tubular magazine having a plurality of chip type circuit elements stacked thereon;

pushing each circuit element stack in said tubular magazines upwardly to a position where the top circuit element in each circuit element stack is positioned at the top opening of each tubular magazine;

horizontally positioning a suction plate having a plurality of suction holes at positions corresponding to said relative positions of said tubular magazines in a manner such that each suction hole is substantially in contact with one of said top circuit elements in said corresponding tubular magazines;

simultaneously applying a suction force to each said suction hole for holding each respective top circuit element thereon;

Horizontally supporting a printed circuit board having a predetermined pattern of laminar conductors on the upper surface thereof;

transferring said suction plate holding each circuit element thereon from said suction position to a position where said printed circuit board is supported horizontally;

positioning said suction plate over said printed circuit board so as to mount each circuit element onto the corresponding position on said printed circuit board; and releasing said suction force to said suction holes for releasing said circuit elements.

In accordance with the present invention, there is also provided an apparatus for mounting chip type circuit elements on a printed circuit board, which comprises:

printed circuit board support means for horizontally supporting a printed circuit board having a predetermined pattern of laminar conductors on the upper surfaces thereof;

a horizontally positioned magazine guide having a plurality of through-holes therein, said through-holes being located at positions corresponding to relative positions of circuit elements to be mounted on said printed circuit board;

a plurality of hollow vertical tubular magazines slidably fitted in said through-holes in said magazine guide, and having top openings substantially in a common horizontal plane, each of said tubular magazines having a hollow interior adapted to hold a stack of a plurality of chip type circuit elements;

circuit element push means for incrementally pushing each circuit element stack in said tubular magazines upwardly to a position where the top circuit element in each circuit element stack is positioned at said top opening of each tubular magazine;

circuit element suction means including a suction plate having a plurality of suction holes at positions corresponding to the relative positions of said tubular magazines fitted in said through-holes of said magazine guide for picking up each said top circuit element in each circuit element stack positioned at said top opening of each tubular magazine; and transfer means adapted to move said circuit element suction means between said suction position and a position where each circuit element held on said suction plate is mounted on said printed circuit board.

In the present invention, two methods are adopted for temporarily supporting circuit elements on the printed circuit board for a certain time until they are introduced into the subsequent step. According to one method, as disclosed in the specification of U.S. Pat. No. 4,127,432, a layer of an adhesive material, for example, a thermosetting material, is preliminarily formed on the printed circuit board at predetermined positions. According to the other method, an adhesive material, for example, a hot-melt adhesive, is applied to each of circuit elements, and when the circuit elements are mounted on the printed circuit board by means of the above-mentioned suction plate, the adhesive material is heated to render it sticky and the circuit elements are temporarily supported on the printed circuit board by the viscose adhesive material.

As a heating means for curing the thermosetting material applied to the printed circuit board or melting the hot-melt adhesive for temporarily supporting the circuit elements on the printed circuit board, a method can be adopted in which the printed circuit board on which the circuit elements are mounted via the thermosetting material is heated while it is being transferred to the subsequent step and a method wherein, during mounting of the circuit elements on the printed circuit board by the suction plate, the printed circuit board is heated as the circuit elements are pressed onto the printed circuit board by means of the suction plate.

DESCRIPTION OF THE DRAWINGS

This invention will be described in detail hereinafter with the aid of the accompanying drawings, in which:

FIG. 6 is a sectional view illustrating a state after suctioning of the circuit elements;

FIG. 7 is a plan view showing a magazine in which circuit elements are stacked;

FIG. 8 is a view showing the longitudinal section of the magazine shown in FIG. 7;

FIG. 9 is a plan view showing a plug member in one embodiment of the magazine;

FIG. 10 is a side view showing the plug member shown in FIG. 9;

FIG. 11 is a front view showing one embodiment of the circuit element to be mounted according to the present invention;

FIG. 12 is a sectional side view of a thrust pin driving mechanism which illustrates a state wherein thrust pins are lowered;

FIG. 14 is a sectional front view showing a suction plate supporting head and a suction plate supporting and driving mechanism;

Referring to FIGS. 1 and 2 showing the overall structure of one embodiment of the circuit element mounting apparatus of the present invention, a belt conveyor 3 is supported on a base 1 to deliver a printed circuit board 2 in the direction of arrow A, the belt conveyor 3 is supported by side plates 60 and 60a for guiding the printed circuit board 2. A printed circuit board-magazine 70 is situated at the entrance end of the belt conveyor 3, and a vertical stack of printed circuit boards 2, each having a predetermined pattern or laminar conductors on the upper surface thereof, are situated in the printed circuit board-magazine 70, with the lowermost printed circuit board being located at the elevation of the surface of the belt conveyor 3. A printed circuit board moving means includes a turnable lever 71 shown schematically in FIGS. 1 and 2. The lever 71 is capable of being turned in such a manner that each lowermost printed circuit board is moved out of the magazine 70 onto the belt conveyor 3 one by one by the lever 71. The operation of the lever 71 is made synchronous with the movement of a suction plate supporting head 10 described hereinafter. Of course, as each lowermost printed circuit board 2 is moved onto the belt conveyor 3, the printed circuit board just above the lowermost printed circuit board will be moved down into position for displacement onto the belt conveyor 3. Instead of the above-mentioned printed circuit board moving means in the form of the lever 71, there may be adopted an automatically operable system whereby the printed circuit boards are pushed out of the magazine 70 one by one by means of a suitable push rod actuated by a piston disposed in a cylinder which receives air under pressure, thereby providing a pneumatic printed circuit board-moving means.

Figure 1:
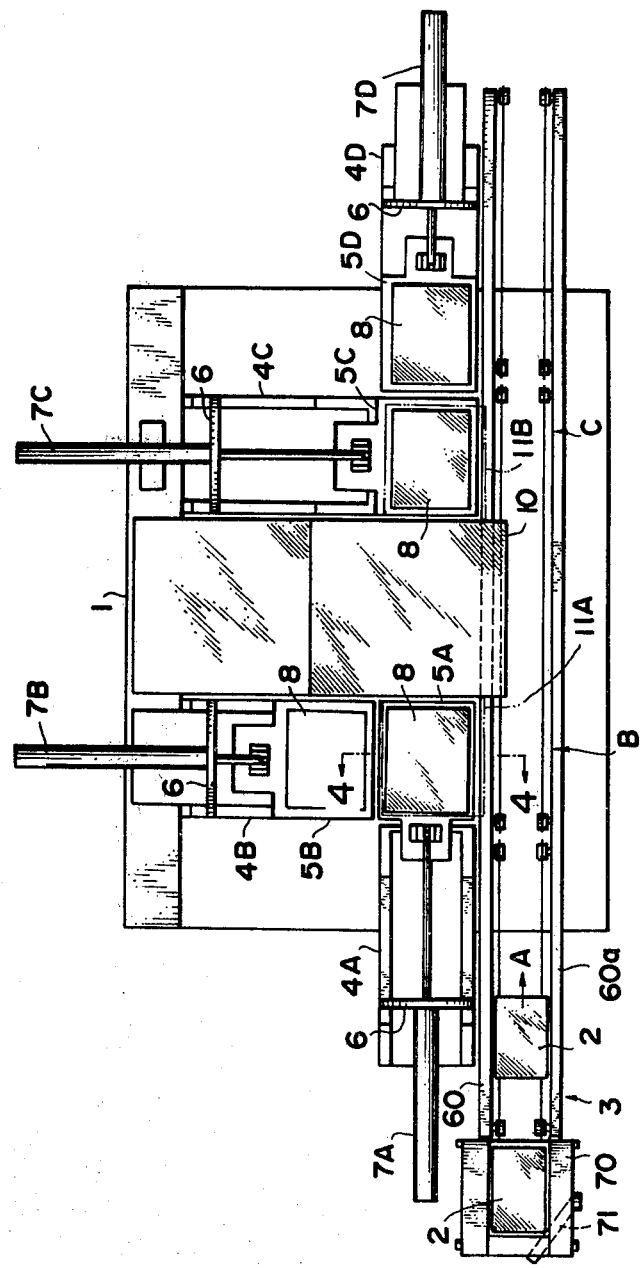
FIG. 1 is a plan view illustrating the entire structure of a circuit element mounting apparatus that is used in one embodiment of the circuit element mounting method of the present invention, in which circuit elements are mounted by suction force.

Supporting frames 4A through 4D are affixed to the base 1, and magazine guide supporting stands 5A through 5D are movably mounted on the supporting frames 4A through 4D. The magazine guide supporting stands 5A through 5D are arranged so that they can be moved along the supporting frames 4A through 4D by magazine exchanging pneumatic cylinders 7A through 7D affixed through attachment plates 6 to the supporting frames 4A through 4D, respectively.

A magazine guide 8 is mounted on each of the magazine guide supporting stands 5A through 5D, and a suction plate supporting head 10 is mounted on the base 1 so that is can move in both vertical and horizontal directions. Suction plates 11A and 11B are vertically movably supported on both sides of the suction plate supporting head 10. As show in FIGS. 3 through 6, the magazine guide 8 comprises a magazine guide upper plate 20, a magazine guide lower plate 21 and a stanchion 22 connecting both the upper and lower plates 20 and 21 to each other. Square insertion holes 24 are formed on the magazine guide upper plate 20 at positions corresponding to the predetermined positions for insertion of magazines 23. Angular recesses 25 are formed on the magazine guide lower plate 21 at positions corresponding to the predetermined positions for insertion of the magazines 23. A circular hole 27 is formed in the central portion of each angular recess 24 for insertion of a thrust pin 26. In this arrangement, the insertion holes 24 are formed on the magazine guide upper plate 20 at positions corresponding to the mounting positions of the corresponding circuit elements on the printed circuit board. A pair of registration holes 65 are further formed on the magazine guide upper plate 20.

As shown in FIGS. 7 through 10, the magazine 23, with circuit elements stacked therein, comprises a tube in the form of a hollow rectangular parallelepiped 23a having a rectangular bore 31 formed therein and a plug member 32 movably inserted in the bore 31. The tube 23a is formed from metal, nylon or the like by injection molding, and the plug member 32 is formed on a resin such as styrol or a metal. About 100 circuit elements 30, such as chip condensers, are contained and stacked in the bores 31, and each bore 31 is formed so that the cross section thereof has a rectangular shape of a size substantially equal to the outer size of the circuit element 30. As shown in FIGS. 9 and 10, each plug member 32 comprises a platform portion 32a for supporting the circuit elements 30 in the stacked state and an engaging portion 32b contacting against the inner face of the bore 31 to prevent falling of the plug member 32 per se. A recess 32c is formed on the lower face of the platform portion 32a so that the recess 32c can be engaged by the top end of a thrust pin 26, described hereinafter, to raise the plug member 32.

If the magazine 23 is formed from nylon or the like, the presence or absence of the circuit element 30 or the kind of the circuit element 30 (e.g. condenser, resistor, jumper, etc.) can be determined from the outside, and the kind and type of circuit element 30 can be printed on its outer surface.

As show in FIGS. 3 through 6, the magazines 23 having the above-mentioned structure are fitted in the insertion holes 24 and angular recesses 24 formed in the magazine guide 8, whereby the magazines 23 are vertically supported. These magazines 23 are disposed so that the top openings 23b of the respective magazines 23 are located substantially in the same plane and the relative positions of the top openings 23b of the magazines 23 correspond to the relative positions of circuit elements to be mounted on the printed circuit board.

As is seen from FIG. 11, a chip condenser 30 stacked as the circuit element in the magazine 23 comprises a substantially rectangular parallelepiped body 30a and electrodes 30b formed on both the sides of the body 30a. The chip condenser 30 has no lead-in wires such as are attached to discrete circuit elements. One surface of the chip condenser 30, that is, one surface of the body 30a, is coated with a known adhesive having no adhesiveness or stickiness at room temperature, for example, a hot-melt adhesive 30c. In this case, according to an automatic operation described hereinafter, mounting of chip condensers 30 on the printed circuit board is performed by locating the surface, coated with the adhesive 30, of each chip condenser 30 at a predetermined position on the printed circuit board so that the electrodes 30b of the condenser 30 are caused to fall in contact with a pattern of laminar conductors formed on the printed circuit board, heating and melting the adhesive 30c to render it sticky and temporarily supporting and fixing the chip condenser 30 on the printed circuit board and soldering the chip condenser 30 to the printed circuit board in a subsequent step. Before the soldering step, the chip condensers 30 are positively affixed to the printed circuit board by the sticking force of the adhesive 30c, and after the soldering step, the chip condensers 30 are tightly bonded to the printed circuit board by the cured and hardened adhesive 30c. Accordingly, the chip condensers 30 are prevented from deviating from their predetermined positions before and during the soldering operation.

The foregoing illustration has been made by reference to a chip condenser as an example of the circuit element 30. However, other circuit elements having no lead-in wires can be mounted according to the above procedures.

Any of a number of known adhesive materials can be appropriately chosen and used as the adhesive 30c as long as it is not sticky or adhesive at room temperature but is molten under heating and readily cured and hardened.

Figure 13:
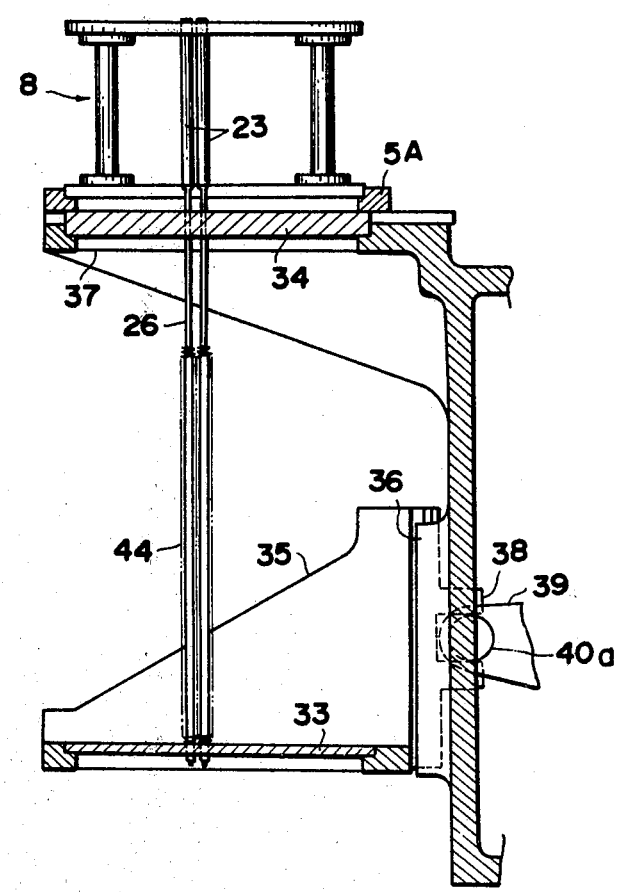
FIG. 13 is a sectional view of the thrust pin driving mechanism shown in FIG. 12, which illustrates the state where thrust pins are raise.

As shown in FIGS. 12 and 13, the above-mentioned thrust pin 26 is affixed to a thrust pin guide bottom plate 33 and is slidably supported by a thrust pin guide top plate 34. The thrust pin guide bottom plate 33 is attached to a bottom plate receiving stand 36, which is fitted on a guie rail 35 mounted on the stand 1 so that the stand 35 can slide in the vertical direction. The thrust pin guide top plate 34 is supported by a top plate receiving stand 37 formed on the base 1. The bottom plate receiving stand 35 has an engaging portion 38 which is engaged by a roller 40a on one of a thrust pin cam lever 39. The thrust pin cam lever 39 is supported by a supporting shaft 41a and is arranged so that it is allowed to make contact with a thrust pin cam 43 via a roller 42a on the other end of the cam lever 39. A buffer spring 44 is mounted on the periphery of the lower portion of the thrust pin 26.

Figure 14A:
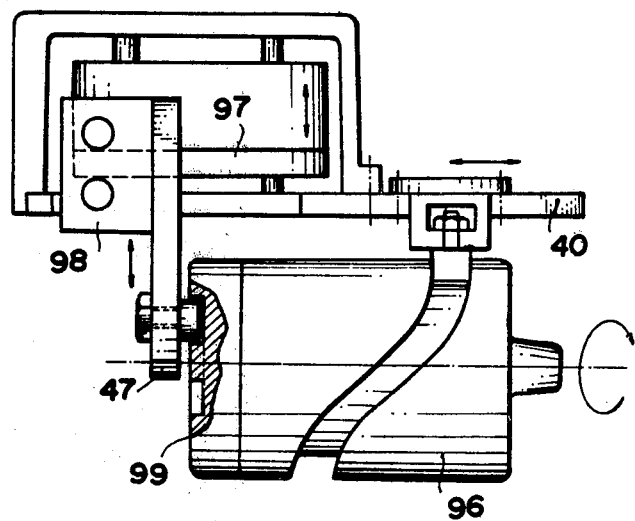
FIG. 14A is a view illustrating a cam mechanism for driving the suction plate supporting head.
Figure 14B:
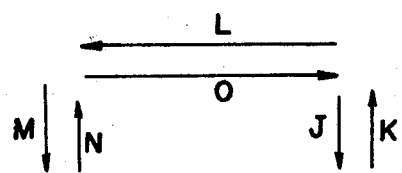
FIG. 14B is a diagram illustrating the directions of movement of the suction plate supporting head.
Figure 15:
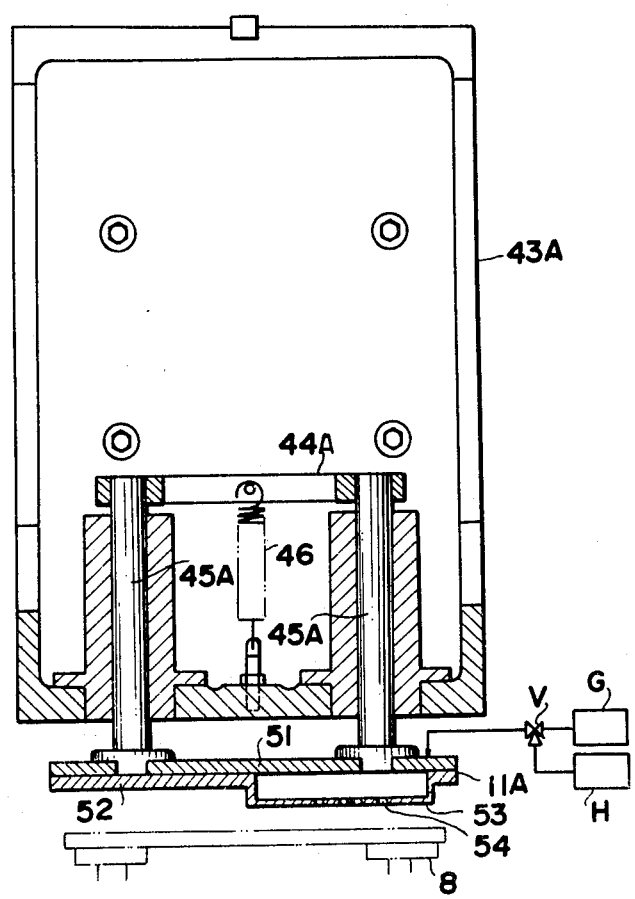
FIG. 15 is a view showing a section taken along the line 15—15 in FIG. 14.

The suction plate supporting head 10 is vertically movably mounted on rods 41 disposed vertically on a slide plate 40, as shown in FIG. 14, and the slide plate 40 is slidably supported in the horizontal direction by a supporting rail 42 mounted on the base 1. As shown in FIG. 14A, the slide plate 40 is arranged so that it is reciprocatively moved in the horizontal direction by a cylindrical cam 96. A vertically moving plate 47 is fitted to an attachment block 97 of the suction plate supporting head 10 slidably horizontally converted to a slide plate 98. The suction plate supporting head 10 is vertically moved by the vertically moving plate 47 driven by a groove cam 99. Accordingly, the suction plate supporting head 10 is supported on the base 1 so that it can move in the vertical and horizontal directions as indicated by arrows J. K. L. M. N and O in FIG. 14B. Suction plate supporting frames 43A and 43B are affixed to either side of the suction plate supporting head 10. As shown in FIG. 15, rods 45A each having an upper end connected to a connecting bar 44A are vertically movably supported on the suction plate supporting frame 43A and a suction plate 11A is fixed to the lower ends of the rods 45A. An expansion spring 46 is disposed between the connecting bar 44A and the lower portion of the suction plate supporting frame 43A. The suction plate 11A is urged downwardly by the spring 46. Similarly, a suction plate 11B is attached to the lower ends of rods 45B vertically movably mounted on the suction plate supporting frame 43B and is urged downwardly by an expansion spring disposed between a connecting bar 44B and the lower portion of the suction plate supporting frame 43B.

Figure 4:
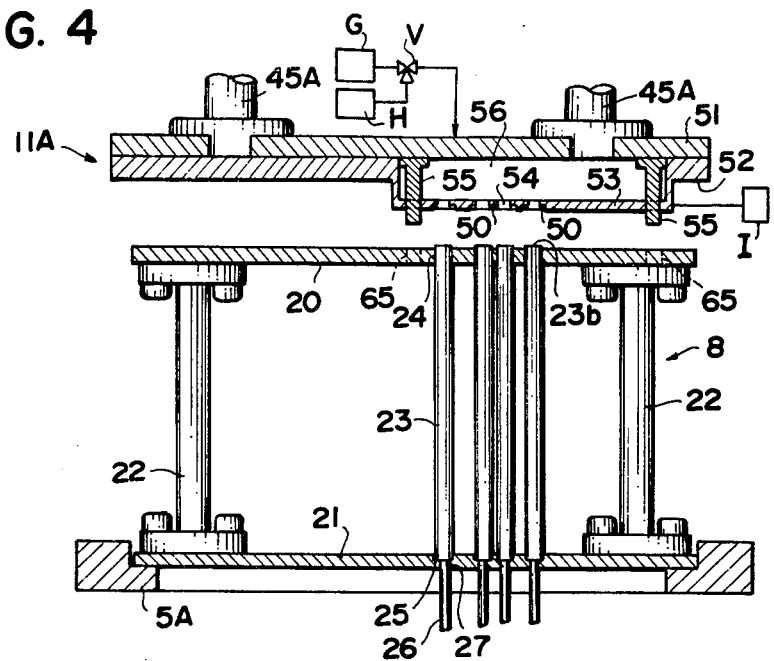
FIG. 4 is a view showing the section taken along the line 4—4 of FIG. 1, which illustrates the state before suctioning of the circuit elements.
Figure 5:
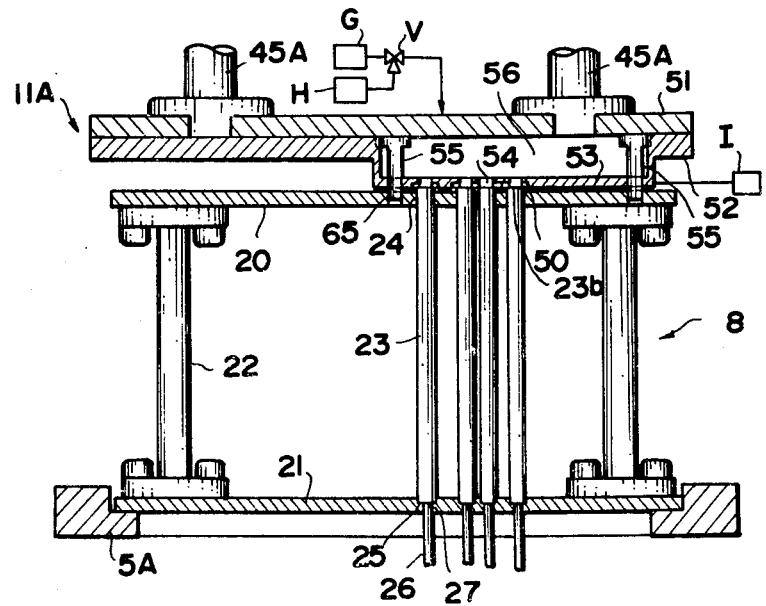
FIG. 5 is a sectional view illustrating a state where the circuit elements are suctional.
Figure 16:
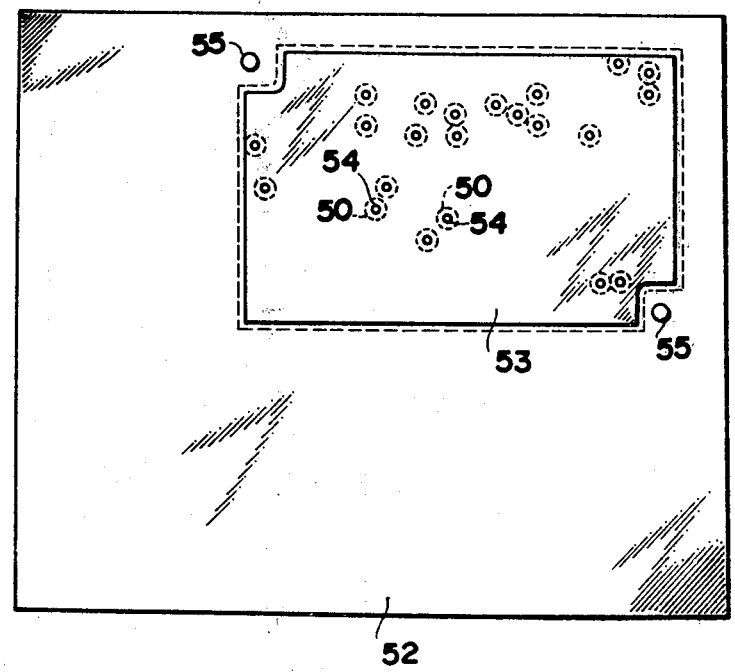
FIG. 16 is a plan view showing a suction face forming member.

The suction plate 11A comprises supporting members 51 attached to the rods 45A and a suction face forming member 52, as shown in FIGS. 4 through 6. A flat suction face 53 is formed on the suction face forming member 52. As shown in FIG. 16, on the flat suction face 53 there are formed round suction holes 54 at relative positions corresponding to the positions of the top openings 23b of the respective magazines 23 vertically arranged in the magazine guide 8. That is, the relative positions of the round suction holes 52 correspond to the relative positions of the circuit elements 30 to be mounted on the printed circuit board 2. The suction plate 11A is provided with an opening connectable to a compressed air source H and a vacuum source G through valve V, (see e.g. FIGS. 4 and 5), which controls communication between the compressed air source H and vacuum source G. As shown in FIG. 16, PTC 50 is embedded around each round suction hole 54 formed on the suction face 53 to surround each round hole 54, whereby there is formed a heating mechanism for heating an adhesive material, for example, a hot-melt adhesive, coated on the circuit element 30 when each circuit element 30 is suctioned at the round suction hole 54 and mounted on the printed circuit board 2 in a manner to be described hereinafter. Reference symbol I represents a power source for PTC 50.

A registration pin 55 is formed in the vicinity of the suction face 53 of the supporting member 51.

The suction plate 11B has the same structure as the above-mentioned structure of the suction plate 11A.

Figure 2:
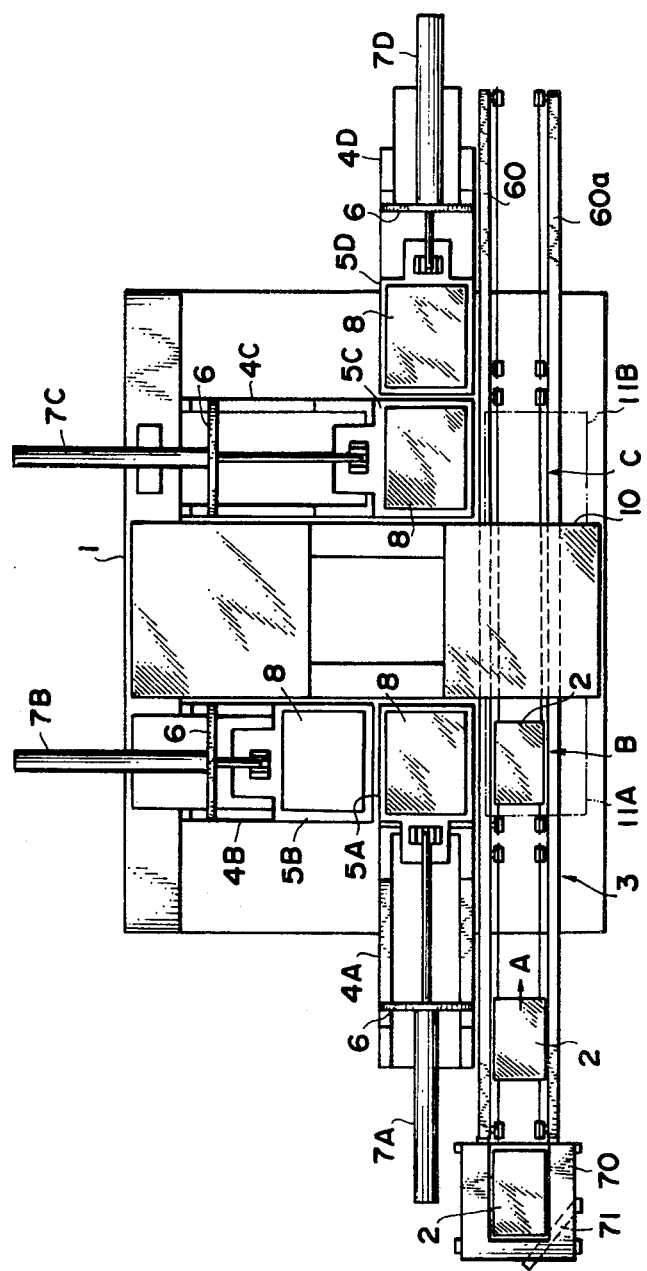
FIG. 2 is a plan view illustrating a state where the circuit elements are transferred to a printed circuit board in the embodiment shown in FIG. 1.
Figure 3:
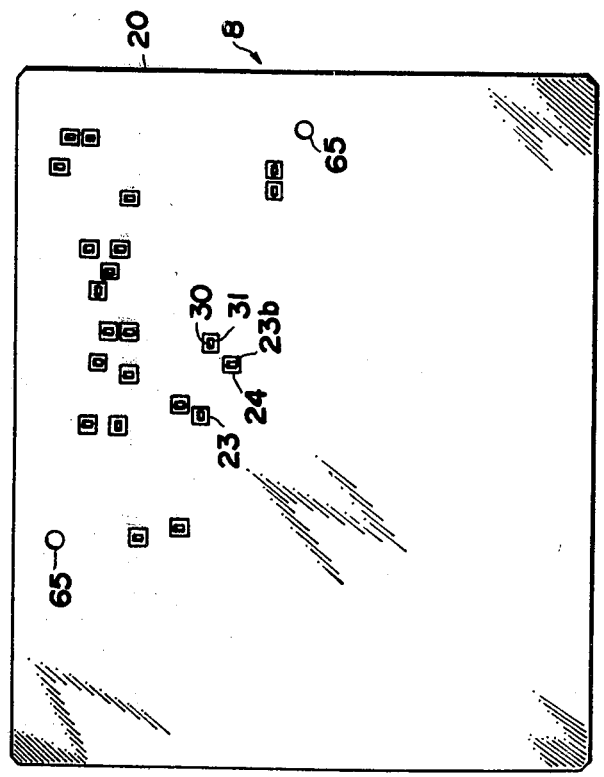
FIG. 3 is a plan view showing a magazine guide in which magazines having circuit elements stacked thereon are arranged.

The structure at the position where mounting of the circuit elements is carried out as indicated by an arrow B in FIGS. 1 and 2 is illustrated in FIGS. 17 through 20. Referring to FIGS. 16 through 20, top face stops 61 and 61a for defining the vertical position of the printed circuit board 2 are affixed to the upper portions of side plates 60 and 60a which act not only as means for supporting the belt conveyor 3 but also as a means for guiding the printed circuit board 2. A front stop 62 for defining the position at which the advance of the printed circuit board 2 is to be stopped is vertically movably disposed between the side plates 60 and 60a by known means. When the printed circuit board 2 is to be stopped at the predetermined position, the front stop 62 is raised; no stopping occurs when the front stop 62 is lowered. A board supporting plate 63 is vertically movably disposed below the printed circuit board 2 by known means such as a pneumatic cylinder to compensate for curves or warps of the printed circuit board 2 and support the board 2 when circuit elements are mounted on the printed circuit board 2. A registering hole 64 is formed at a corner of the printed circuit board 2 so that the registering pin 55 can be fitted in the registering hole 64, and a registering hole 65 is similarly formed on the top plate 20 of the magazine guide 8.

The operation of the above disclosed embodiment will now be described.

The magazines 23, each containing a stack of circuit elements 30 therein, are vertically arranged in the magazine guides 8 so that the top openings 23b of the magazines 23 are located substantially in the same plane, and the magazine guides 8 are placed on respective magazine guide supporting stands 5A through 5D. In the state where the bottom plate receiving stand 35 is brought down to the lowermost position and the thrust pins 26 are lowered as shown in FIG. 12, cylinders 7A and 7C are operated to set the horizontal positional relationship between the magazine guides 8 and the suction plates 11A and 11B as shown in FIG. 1, so that the top surface of the magazine guide 8 on the supporting stand 5A confronts the suction face 53 of the suction plate 11A as shown in FIG. 4. In this state, as shown in FIG. 13, the thrust pin cam lever 39 is turned by the thrust pin cam 43 to lift the bottom plate receiving stand 35 and raise up the plug members 32 until the top face of the topmost circuit element 30 among the circuit elements 30 stacked in each magazine 23 is substantially in agreement with the top opening 23b of the magazine 23, as shown in FIG. 8. Then, the suction plate supporting head 10 is brought down by the vertically moving plate 47, whereby the top opening 23b of the magazine 23 is closely contacted by the suction plate 11A is registered with the magazine 23 by fitting the registration pin 55 into the registration hole 65 formed on the magazine guide upper plate 20.

Next, air in a space 56 between the supporting member 51 and the suction face forming member 52 is evacuated by the vacuum pump G to reduce the pressure in the space 56. By this evacuation, the suction holes 54 cause the topmost circuit element 30 of the circuit element stack to be suctioned from the top opening 23b of the magazine 23. While the vacuum state is being maintained in the space 56, the suction plate supporting head 10 is lifted up by the vertically moving plate 47, and the suction plate 11A is lifted up while in the state where the circuit element 30 is held adjacent the round suction holes 54 of the suction face 53 as shown in FIG. 6.

Figure 17:
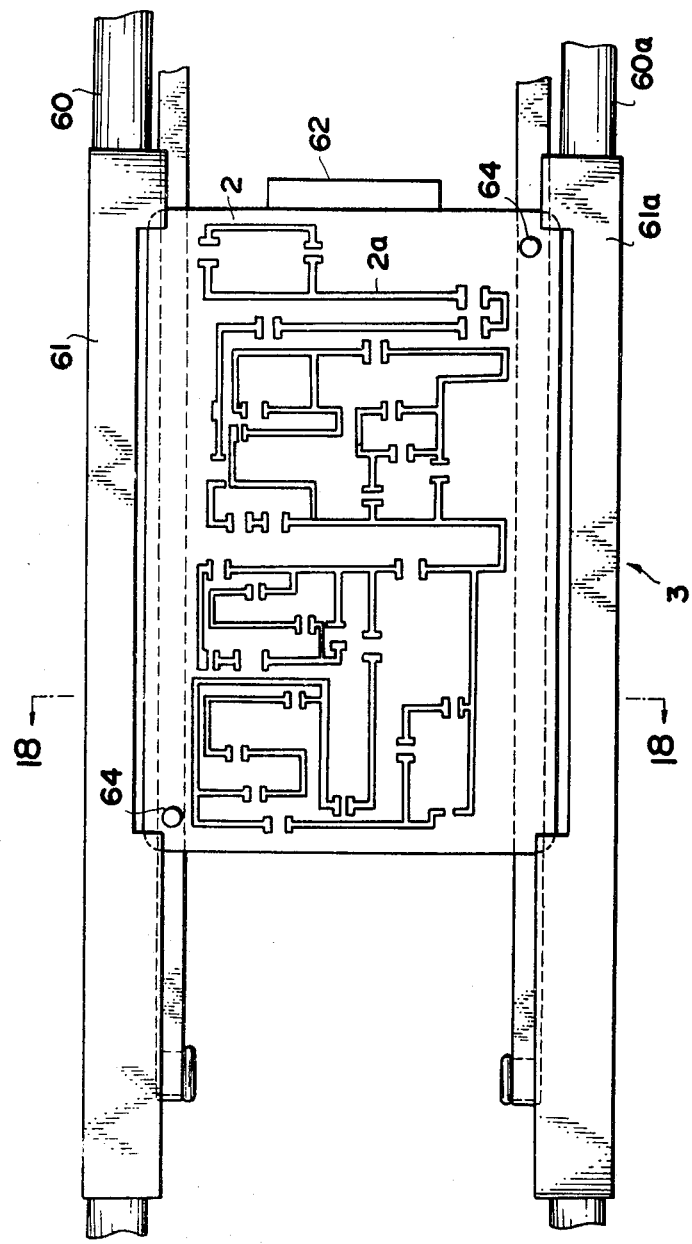
FIG. 17 is a plan view showing a circuit board in the element mounting position.
Figure 18:
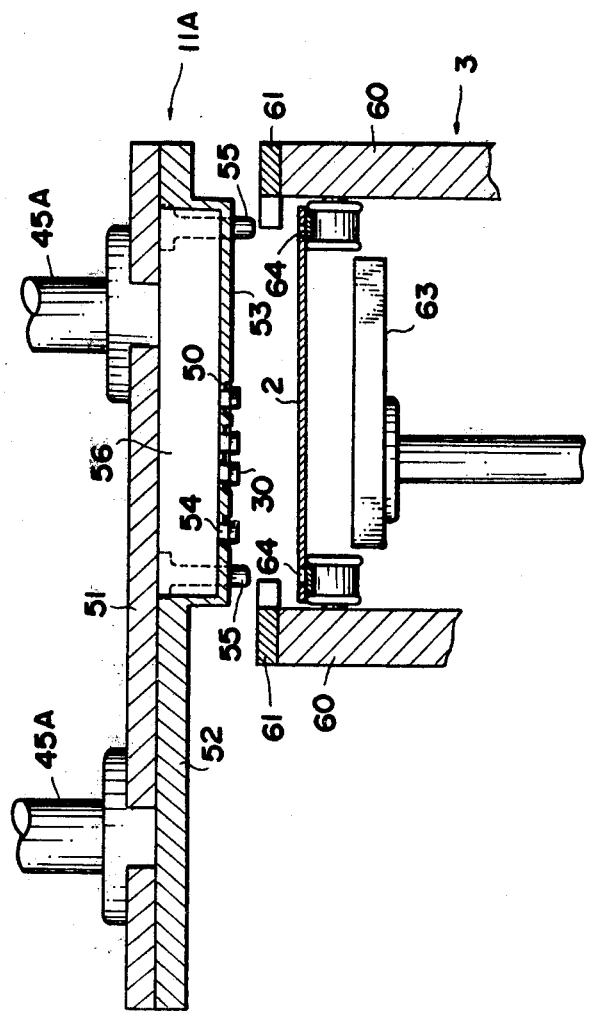
FIG. 18 is a view showing a section taken along the line 18—18 in FIG. 17, which illustrates the state where circuit elements are transferred onto a printed circuit board.
Figure 19:
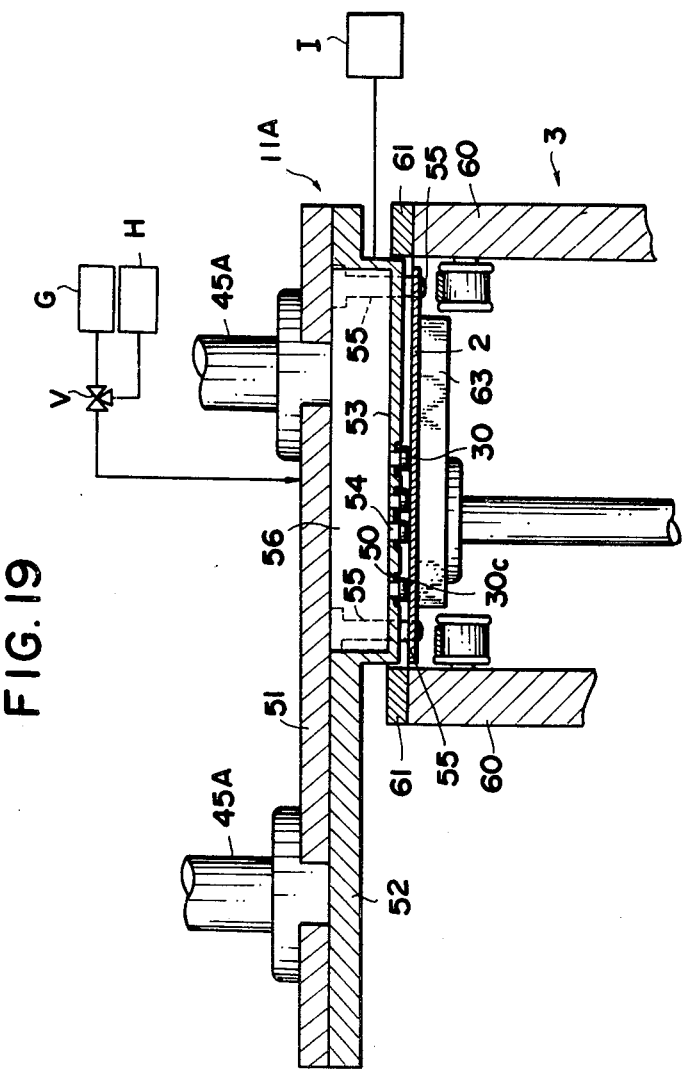
FIG. 19 is a sectional view illustrating a state where circuit elements are mounted.

The printed circuit boards 2 on which circuit elements 30 are to be mounted sequentially are ejected from the printed circuit board-magazine means 70 onto the belt conveyor 3 one by one by means of the lever 71 synchronously with the movement of the suction plate supporting head 10, as shown in FIGS. 1 and 2. In the state where the suction plate 11A is thus lifted up, the slide plate 40 is caused to slide by means of the cylindrical cam 96, so that the suction supporting head 10 is shifted to the position shown in FIG. 2 and the suction plate 11A is located above the printed circuit board 2 having laminar conductors 2a on the top surface thereof, which has been transferred to the circuit element mounting position by the belt conveyor 3, as shown in FIG. 17. Accordingly, the suction face 53 of the suction plate 11A confronts the printed circuit board 2 as shown in FIG. 18. Then, the suction plate supporting head 10 is brought down by the vertically moving plate 47, and simultaneously, the circuit board supporting plate 73 is raised and the circuit element 30 is urged against the printed circuit board 2 under pressure, as shown in FIG. 19. In this case, the suction plate 11A is registered with the printed circuit board 2 by fitting the registration pin 55 into the standard hole 64 on the printed circuit board 2. Since the hot-melt adhesive 30c has been preliminarily applied to the circuit element 30, as soon as the circuit element 30 is engaged by the printed circuit board 2, electricity is applied to the PTC 50. By the heat so generated, the adhesive 30c is heated to effect a bonding action whereby the circuit element 30 is bonded onto the printed circuit board 2 with high precision. Then, the valve V is operated to stop the evacuation of air from the space 56, and simultaneously, air is supplied to the space 56 from the compressed-air source H, as needed, so as to enhance separation of the circuit element 30 from the suction hole 54.

Figure 20:
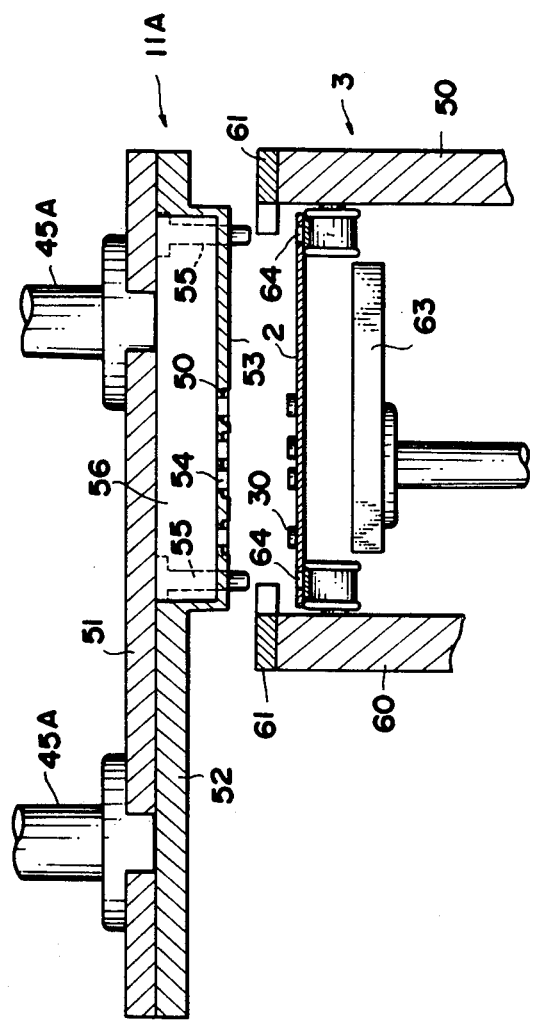
FIG. 20 is a sectional view illustrating a state after mounting of circuit elements.

Next, the suction plate 11A is raised as shown in FIG. 20, and the suction plate 11A is returned by the suction plate supporting head 10 to the original position for suctioning the next circuit elements 30 from the magazines 23. The front stop 62 is then released, and the printed circuit board 2 is delivered to a position C, where additional circuit element mounting is carried out as shown in FIG. 1, by means of the belt conveyor 3. In the circuit element mounting position C, the above-mentioned procedures are repeated between the suction plate 11B and the printed circuit board 2. After one topmost circuit element 30 is taken out of each stack of the circuit elements 30 through the top opening 23b of each magazine 23, the subsequent circuit elements are pushed up by the thrust pins 26 until the upper faces thereof are in agreement with the level of the top opening 23b of each magazine 23 and these circuit elements 30 await a subsequent delivery and mounting operation.

When the above procedures are repeated and the supplies all of the circuit elements 30 in the magazines 23 supported in the magazine guides 8 on the magazine guide supporting stands 5A and 5C have been exhausted, the thrust pins 26 are pulled out of the magazines 23 in the magazine guide 8 by the action of the thrust pin cam 43 as shown in FIG. 12, and in this state, the cylinders 7A and 7C are returned to their original positions and the cylinders 7B and 7D are actuated to move the magazine guide supporting stands 5B and 5D to positions confronting the suction plates 11A and 11B. Accordingly, at this time, the circuit element transfer and mounting procedures are conducted between the magazine guides 8 on the magazine guide supporting stands 5B and 5D and the suction plates 11A and 11B. During this period, fresh magazines 23 stacked with circuit elements 30 are charged in the empty magazine guides 8 on the magazine guide supporting stands 5A and 5C. Accordingly, in this embodiment, by using two pairs of the magazine supporting stands alternately in the above-mentioned manner, it is possible to perform a continuous operation smoothly.

As will be apparent from the foregoing description of a preferred embodiment, the magazines 23 are arranged in the magazine guide 8 at positions corresponding the circuit element mounting positions on the printed circuit boards 2. The circuit elements 30, having previously coated on them a layer of an adhesive material, such as a hot-melt adhesive, are suctioned by the vacuum action of the suction plates 11A and 11B and then delivered to a printed circuit board 2 having a pattern or laminar conductors formed on the top surface thereof after which they are affixed to the printed circuit board 2 by heating. Accordingly, it is possible to mount the circuit elements 30 on the printed circuit board 2 under a uniform pressure, and the mounting operation can be performed with high precision obviating defective products. Furthermore, every time one circuit element 30 is suctioned out of a magazine, a subsequent circuit element 30 is pushed up to the upper surface of the magazine 23 by a thrust pin 26. Therefore, by repeating this procedure, circuit elements can be mounted automatically one by one to the printed circuit board 2. Still further, since the magazine 23 is formed so that the outer surface has a square shape, by changing the direction of insertion of the magazine 23 into the magazine guide 8 by 90°, the mounting direction of the circuit elements 30 can be changed.

In the foregoing embodiment, the suction plates are disposed at two regions, and mounting of circuit elements on the printed circuit board is carried out in two regions. When the space between two adjacent circuit elements to be mounted is smaller than the minimum space between two adjacent magazines, it is possible to mount two circuit elements at one time. The above arrangement is therefore adopted so that mounting of circuit elements can be performed in two sequential operations. Hence, one of the suction plates may be omitted depending on its need. In the foregoing embodiment, round suction holes are formed on the suction face of the suction plate so that one hole suctions one circuit element. There may be adopted a modification where the holes are arranged so that a plurality of holes are used for suctioning a single circuit element. Moreover, in the foregoing embodiment, the suction plate is shifted by a linear movement. There may be adopted a modification in which shifting of the suction plate is accomplished by a rotary movement or the like.

In the foregoing embodiment, an adhesive material such as a hot-melt adhesive, is applied to the circuit elements in advance. Instead, there may be adopted a modification whereby a thermosetting material is applied to the circuit elements as they are being delivered, or such adhesive material can be applied to the printed circuit boards in advance as taught in the specification of U.S. Pat. No. 4,127,432.

A preferred embodiment adopting the method in which an adhesive layer is formed in advance on a printed circuit board at predetermined positions whereat circuit elements are to be mounted, somewhat similar to that illustrated in the specification of U.S. Pat. No. 4,127,432 will now be described.

Figure 21:
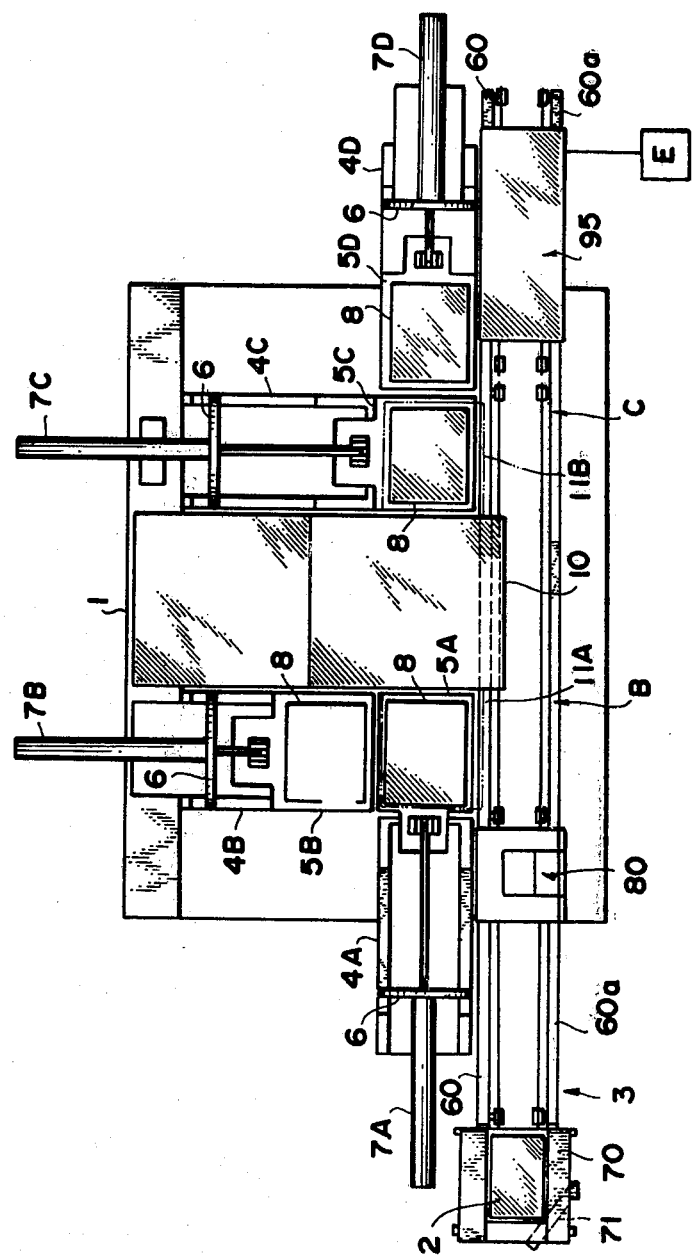
FIG. 21 is a plan view illustrating another embodiment of the circuit element mounting apparatus according to the present invention.

Referring to FIG. 21 illustrating this second embodiment, an adhesive applying device 80 is disposed to apply an adhesive to a printed circuit board 2 while the board 2 is being transferred from the printed circuit board-magazine means 70 to the circuit element mounting position B, and a known drying furnace 95 is disposed to cure and harden the adhesive temporarily affixing the circuit elements to the printed circuit board 2 while the printed circuit board 2 is being delivered to a subsequent step such as the soldering step which occurs after the circuit elements have been mounted on the printed circuit board 2. In these two respects, the second embodiment is different from the above-mentioned first embodiment, but other structural features and arrangements of the second embodiment are the same as those in the first embodiment. Therefore, a detailed description of the structural features and arrangements is omitted.

One embodiment of the adhesive applying device 80 for applying an adhesive to printed circuit boards 2 will now be described with reference to FIGS. 21 through 23.

Figure 22:
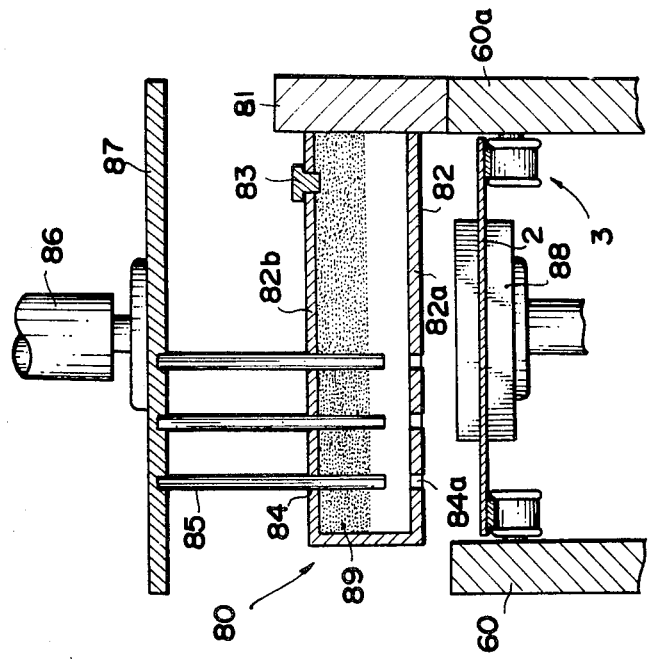
FIG. 22 is a sectional view illustrating one embodiment of a devise for applying a circuit element-bonding adhesive to a printed circuit board, which illustrates the state where a vertically moving pin is lowered.
Figure 23:
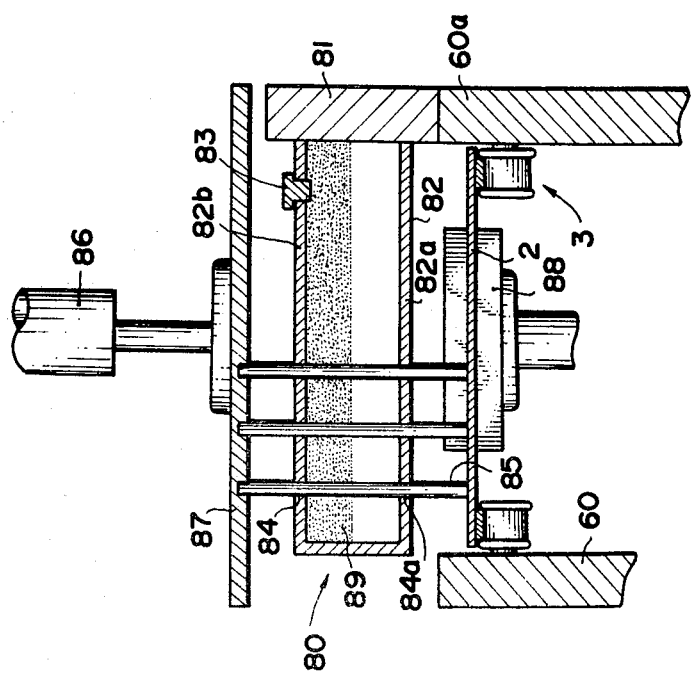
FIG. 23 is a sectional view illustrating a state where the vertically moving pin of FIG. 22 is raised.

Referring to FIGS. 22 and 23, a supporting member 81 is affixed to and supported on the side plate 60a of the belt conveyor 3, and an adhesive vessel 82 is affixed to and supported on the supporting member 81. An adhesive supply plug 83 is removably attached to the top face of the adhesive vessel 82. A printed circuit board 2 on the belt conveyor 3 is located below the adhesive vessel 82 and parallel to the lower face 82a of the vessel 82. A plurality of through-holes 84 and 84a are formed on the upper face 82b and lower face 82d, respectively, of the adhesive vessel 82 at positions corresponding to the circuit element mounting positions on the printed circuit board 2. A plurality of vertically moving pins 85 inserted through the through-holes 84 and 84a of the adhesive vessel 82 are affixed to a movable plate 87 which is movable to the vertical direction above the adhesive vessel 82 while parallel to the top face 82b of the adhesive vessel 82 by a known pneumatic cylinder 86. Reference number 88 represents a stop for stopping the printed circuit board 2 at a predetermined position. The stop 88 is vertically moved by a known pneumatic cylinder. More specifically, the stop 88 is raised when the printed circuit board 2 is to be stopped, and the stop 88 is lowered when the board is to be permitted to pass.

Figure 24:
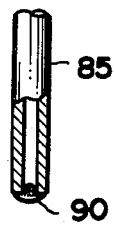
FIG. 24 is an enlarged view showing the top end of the vertically moving pin of FIGS. 22 and 23.

In the state where the movable plate 87 is brought down and the through-holes 84 and 84a are occupied by the vertically moving pins 85 as shown in FIG. 22, the adhesive vessel 82 is kept sealed, and when the adhesive supply plug 83 is removed, supply of the adhesive becomes possible. As shown in FIG. 24, each of the vertically moving pins 85 is constructed of a stainless steel pipe and is shaped to have an outer diameter of about 0.9 mm and an inner diameter of about 0.4 mm.

In the above-mentioned structure, the vertically moving pins 85 are lowered to seal the adhesive vessel 82 as shown in FIG. 22. Then, the vertically moving pins 85 are raised to open the through-holes 84a as shown in FIG. 23. When the pins 85 are brought down again, the adhesive 89 which has spread to the vicinity of the lower portions of the vertically moving pins 85 adheres to the lower end faces of the pins 85 and gathers as indicated by reference numeral 90 in FIG. 24. When the vertically moving pins 85 are lowered further and caused to engage the printed circuit board 2 as shown in FIG. 22, the adhesive 89 is applied to predetermined circuit element mounting positions on the printed circuit board 2 as shown in FIG. 22, the adhesive 89 is applied to predetermined circuit element mounting positions on the printed circuit board 2 in sufficient amounts. In this case, the amount of the adhesive applied varies depending on the time during which the through-holes 84a are kept open, the vascosity of the adhesive and other conditions. As a result of experiments, it has been confirmed that when the diameter of the through-hole 84a (the outer diameter of the vertically moving pin 85) is 0.9 mm, the viscosity of an epoxy type adhesive 89 is 1000 poises and the time for opening of the through-hole 84a is adjusted to about 0.1 to about 0.5 seconds, the adhesive is applied in an amount suitable for bonding of chip type circuit elements such as chip condensers, that is, sufficient to support about 0.2 to about 0.5 mg for each circuit element mounting position.

Figure 26:
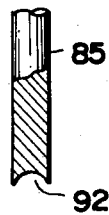

As the vertically moving pin 85, there may be employed not only the pipe-shaped pin shown in FIG. 24 but also a pin 85 having a recess 91 on its lower end face as shown in FIG. 26.

As will be apparent from the foregoing illustration, according to this embodiment, it is possible to automatically apply an adhesive in advance to a printed circuit board in an amount sufficient for bonding of a circuit element at each circuit element mounting position.

A novel thermosetting material which is preferably employed in the embodiment illustrated in FIG. 21 will now be described.

It has been found that when a thermosetting adhesive composition comprising 100 parts by volume of an epoxy resin and 50 to 80 parts by volume of an acrylic acid ester resin in the codissolved state is used in the embodiment shown in FIG. 21, especially good results are obtained.

As the epoxy resin, there is preferably employed a bisphenol glycidyl ester type epoxide, for example, a condensation product of bisphenol A and epichlorohydrin, and it is preferred that the molecular weight of this epoxy resin be in the range of from 350 to 1200. As the acrylic acid ester resin, there is preferably employed a copolymer of alkyl esters of acrylic acid, for example, a copolymer of at least two monomers selected from 2-ethylhexyl acrylate, butyl acrylate and ethyl acrylate.

This adhesive composition is preferably prepared by mixing the epoxy resin and a curing agent with the acrylic acid ester resin under agitation in an appropriate solvent such as toluene. It is preferred that the agitation be carried out at room temperature by using an ordinary agitator such as a crushing mixer.

The so prepared adhesive composition having an appropriate viscosity can be applied to very narrow areas in appropriate amounts on a printed circuit board by using the adhesive applying device shown in FIGS. 22 through 26, and when the printed circuit board is heated for curing the adhesive composition after mounting of circuit elements on the printed circuit board, the adhesive composition does not flow or spread at all and the circuit elements can be bonded and fixed to the printed circuit board with high precision very effectively.

This novel adhesive will now be described in detail by reference to the following Example.

EXAMPLE

To 100 parts by volume of an epoxy resin (Epon 828 manufactured by Shell Chemical Co.) there was added 5 parts by volume of a curing agent (Imidazole 2E4MZ manufactured by Shikoku Kasei K. K.), and they were mixed at room temperature under agitation. Then, 37% by volume of the so obtained mixture, 22% of volume of an acrylic acid ester resig (terpolymer composed by 2-ethylhexyl acrylate, butyl acrylate and ethyl acrylate) and 43% by volume of toluene were mixed under agitation at room temperature for about 1 hour by means of a crushing mixer.

The obtained composition was pasty, and when it was heated, it did not flow or spread at all.

In the second embodiment illustrated in FIG. 21, the so obtained adhesive composition is applied to a printed circuit board 2 at predetermined positions as shown in FIGS. 22 to 26, and circuit elements 30 are mounted on said printed circuit board 2 at the predetermined position by the suction action of suction plates 11A and 11B as in the first embodiment illustrated in FIGS. 1 and 2. Then, the so applied adhesive composition is heated and cured.

As the heating means, there may be adopted a method in which PTC is embedded in the suction plates 11A and 11B as in the first embodiment, or a method in which a known drying furance 95 including an electric heater is disposed at a desirable position on the side plates 60 and 60a of the belt conveyor 3 as shown in FIG. 21. These two methods may be adopted in combination. When the drying furnace 95 is employed, while the printed circuit board 2 having circuit elements mounted thereon is being delivered by the belt conveyor 3, the printed circuit board is passed through the drying furnace 95 and the adhesive composition is heated and cured. Reference symbol E in FIG. 21 represents a power source for the drying furnace 95. Furthermore, instead of having PTC embedded in the suction plates 11A and 11B, there may be employed nichrome wires embedded in the suction plates 11A and 11B. In this case, electricity is applied to the nichrome wires and the suction plates are continuously maintained at a high temperature. Moreover, there may be adopted a method in which nozzles for jetting hot air are disposed on the suction plates to head and cure the adhesive composition for bonding circuit elements to the printed circuit board.

Figure 27:
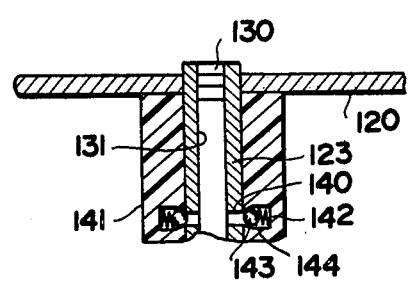
FIG. 27 is a sectional view illustrating part of another form of the magazine.
Figure 25:
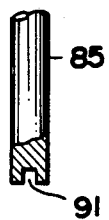
FIGS. 25 and 26 are enlarged views showing other forms of the vertically moving pin of FIGS. 22–26.

Another embodiment of the magazine that can be applied to the present invention will now be described. Referring to FIG. 27, engaging holes 140 are formed on both side faces of a magazine 123 having a through-hole 131 in which a circuit element 130 is to be contained. A supporting member 141 is affixed to a magazine guide top plate 120 adjacent the magazine 123. A ball click mechanism including a steel ball 143 and a compression spring 144 is disposed in a recess 142 of the supporting member 141. In the state where the magazine 123 is inserted in the magazine guide, the steel ball 143 is fitted in the engaging hole 140, thereby ensuring against shaking or vertical movement of the magazine 123.

In the structure shown in FIG. 27, the engaging hole 140 is formed on each of both the side faces of the magazine 123. However, the engaging hole 140 may be formed at only one point on any of the side faces. Of course, a recess may be formed instead of the engaging hole.

Figure 28:
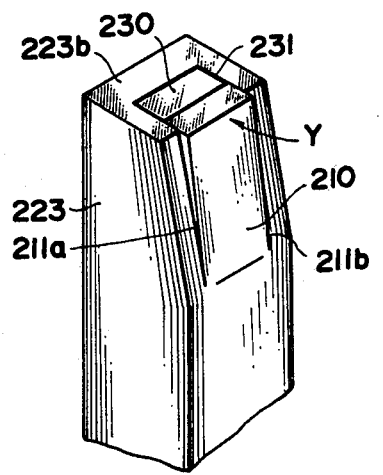
FIG. 28 is a perspective view illustrating another form of the top opening of the magazine.

Another form of the top opening of the magazine will now be described. Referring to FIG. 28, a resilient elastic tongue 210 is formed at a top opening 223b integrally therewith in a state slightly bent inwardly so that the elastic piece 210 is separated from the top opening 223b by cut grooves 211a and 211b and the inner face of the elastic piece 210 forms one of the four faces of a through-hole 231.

The structure of the magazine 223 of this form except for the top opening, is the same as the structure shown in FIG. 8 or FIG. 27. Circuit elements 230 are held in the stacked state by a plug member inserted in the through-hole 231.

In this instance, if the resilient elastic tongue 210 is arranged so that the size of the rectangular opening defined by the inner face of the resilient elastic tongue 210 and the other inner faces of the magazine 223, is slightly smaller than the size of the circuit element 230, the circuit element 230 located at the opening of the magazine 223 is subjected to a pressing force acting in the direction of arrow Y from the resilient elastic tongue 210. As a result, the circuit element 230 is held in close engagement with the standard inner face of the through-hole 231.

According to this embodiment, when circuit elements 230 are mounted on the printed circuit board by suing the magazine 223, shaking movement of circuit elements 230 in the through-hole can be eliminated and they are always held in a state where they are in close engagement with the inner face of the through-hole 231. Therefore, precise positioning can be accomplished and the mounting operation can be performed with high precision while preventing deviation from the mounting positions.

A pressing elastic tongue may be formed on each end of the square pillar, and the inner face of each pressing elastic tongue may be flat or curved.

Another embodiment of the thrust pin mechanism that can be applied to the present invention will now be described with reference to FIGS. 29 and 30. In this embodiment, removal and exchange of thrust pins can be accomplished very easily.

Figure 30:
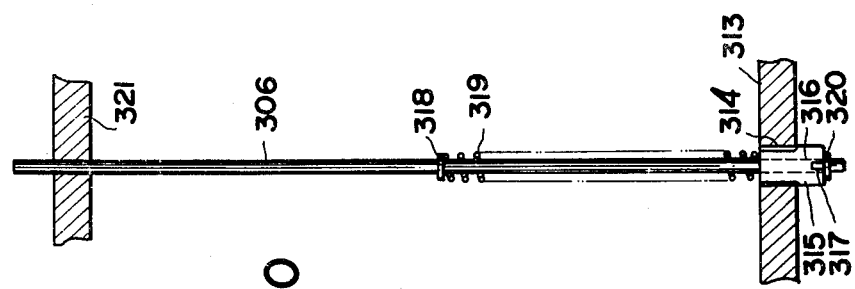
FIG. 30 is an enlarged side view showing the thrust pin mechanism illustrated in FIG. 29.
Figure 29:
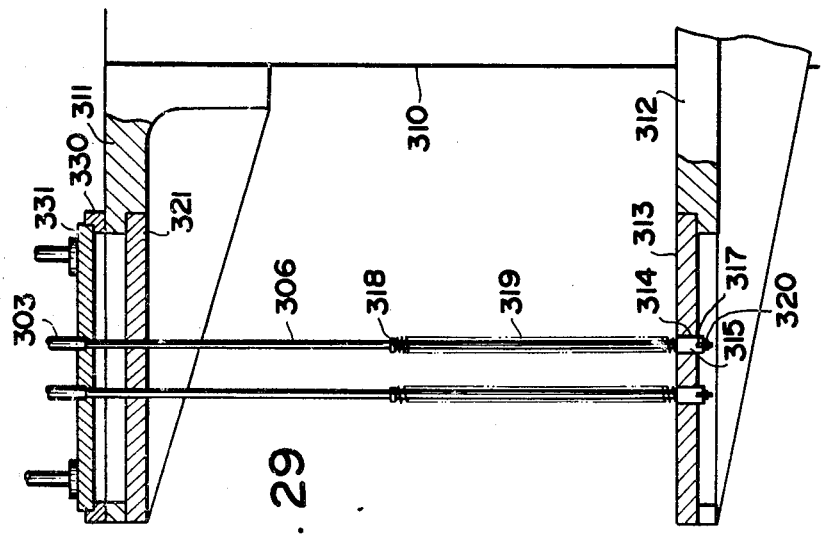
FIG. 29 is a side view showing the entire structure of another embodiment of the circuit element thrust pin mechanism.

Referring to FIGS. 29 and 30, a fixed guide plate attachment stand 311 is affixed to a base 310 of the mechanism, and a movable guide plate attachment stand 312 is mounted on the base 310 so that it can move vertically with respect to the base 310. A movable guide plate 313 is fixedly mounted on the movable guide plate attachment stand 312 to support the thrust pins 306. Screw holes 314 are formed on the movable guide plate 313 at positions where the thrust pins 306 are attached, and dismounting screw pins 315 are screwed in the screw holes 314. A through-hole 316 is formed at the center of each dismounting screw pin 315, and a driver groove 317 is formed on the lower end face thereof. The dismounting screw pin 315 is screwed into the screw hole 314 by utilizing this driver groove 317. A stop ring 318 having an outer diameter smaller than that of the dismounting screw pin 315 is affixed to the middle of the thrust pin 306, and a compression spring 319 is disposed so that it falls in abutting contact with the stop ring 318.

The thrust pin 306 is inserted into the through-hole 316 of the dismounting screw pin 315 and is downardly slidably attached to the dismounting screw pin 315 by means of a stop ring 320. The thrust pin 306 is guided in the vertical direction by the fixed guide plate 321 affixed to the fixed guide plate attachment stand 311, and is moved in the vertical direction according to the vertical movement of the movable guide plate attachment stand 312. In this embodiment, the thrust pin mechanism is arranged so that when a magazine guide 331 is placed on a magazine guide supporting stand 330, the top end of each thrust pin 306 is caused to fall in abutting contact with a plug member in a magazine supported by the magazine guide 331.

In this embodiment, the movable guide attachment stand 312 is raised up, each time, by a distance corresponding to the thickness of one circuit element and with this rising movement, the top ends of the thrust pins 306 are elevated to push up the plug members in the magazine 303. In this case, since the thrust pins 306 are not directly fixed to the movable guide plate 313 but only urged upwardly by the compression springs 319, shocks applied to the thrust pins 306, plug members and circuit elements during thrusting can be absorbed. When thrust pins 306 are bent or damaged by application of some extraordinary load or the like, they should be exchange for fresh thrust pins. In this instance, the stop ring 320 is removed and the dismounting screw pin 315 is taken out by a driver or the like by utilizing the driver groove 317, and then, the thrust pin 306 is pulled downwardly. Thus, the thrust pin can easily be dismounted.

In the above embodiment, the driver groove 317 is formed on the dismounting screw pin 315. Of course, a cross groove or square recess may be formed instead of this driver groove 317 so that attachment and dismounting of thrust pins can be performed by a tool other than a standard screw driver.

As is seen from the foregoing illustration, in the thrust pin mechanism of this embodiment, since the thrust pins are fitted and inserted in dismounting screw pins having an outer diameter larger than the outer diameter of the stop rings of the thrust pins, dismounting and exchange of the thrust pins can be performed very easily.

As will readily be understood from the foregoing illustration, according to the present invention, a plurality of circuit elements can be mounted on the top surface of a printed circuit broad, on which there is disposed a pattern of laminar conductors, by the flat suction plates, under a uniform pressing force and therefore, circuit elements can be mounted on the printed circuit board at predetermined position safely and assuredly with very high precision.

What is claimed is:

1. An apparatus for mounting chip type circuit elements on a printed circuit board, said apparatus comprising printed circuit board support means for horizontally supporting a printed circuit board having a predetermined pattern of laminar conductors on the upper surface thereof;

a magazine guide having a plurality of through-holes therein, said through-holes being located at positions corresponding to relative positions of circuit elements to be mounted on said printed circuit board;

a plurality of hollow tubular magazines fitted in said through-holes in said magazine guide, and having top openings substantially in a common horizontal plane, each of said tubular magazines having a hollow interior adapted to hold a stack of a plurality of chip type circuit elements;

circuit element push means adjacent said magazine for incrementally pushing each circuit element stack in said tubular magazines upwardly to a position where the top circuit element in each circuit element stack is positioned at said top opening of each tubular magazine;

circuit element suction means including a flat suction plate having a plurality of suction holes at positions corresponding to relative positions of said tubular magazines fitted in said through-holes of said magazine guide for suctioning each said top circuit element positioned at said top opening in each circuit element stack of each tubular magazine and for mounting each circuit element suctioned on said flat suction plate on said printed circuit broad; and transfer means for (a) moving said flat suction plate between said suction position and an intermediate position where each respective circuit element suctioned on said flat suction plate overlies in precise vertical alignment a corresponding respective position on the upper surface of the printed circuit board at which said circuit element is to be mounted and (b) vertically moving at least one of said suction plate and printed circuit board until said circuit elements, still suctioned in said suction plate, are brought into contact with the printed circuit board, said transfer means including a suction plate supporting head supporting the flat suction plate for movement, and means for releasing said circuit elements from said suction plate after said circuit elements are brought into contact with the printed circuit board, so that each said circuit element is suctioned on said flat suction plate and mounted precisely under a uniform pressure on said upper surface of said printed circuit board.

2. Apparatus according to claim 1 wherein the circuit element push means includes a thrust pin.

3. Apparatus according to claim 2 wherein said circuit element push means includes a thrust pin guide top plate, a rotatably mounted cam, a bottom plate receiving stand vertically movable in response to rotation of said cam, and a thrust pin guide bottom plate mounted on said bottom plate receiving stand, said thrust pin being fixedly mounted on said thrust pin guide bottom plate and slidably supported in said thrust pin guide top plate.

4. Apparatus according to claim 1 wherein the circuit element push means includes a movable guide plate, a dismounting screw pin threaded into the movable guide plate, a thrust pin inserted in a through-hole formed in the screw pin, a first stop ring mounted on the lower end of the thrust pin, second stop ring mounted on the middle of the thrust pin, a compression spring disposed between said second stop ring and said screw pin, and a fixed guide plate for guiding said thrust pin.

5. Apparatus according to claim 1 wherein the magazine guide includes a magazine guide upper plate having an insertion hole formed therein and a magazine guide lower plate having a stepped hole formed therein.

6. Apparatus according to claim 1 wherein the circuit element suction means includes heating means.

7. Apparatus according to claim 1 further comprising means for coating an adhesive material on the surface of each circuit element to be mounted.

8. Apparatus according to claim 1 further comprising a support rail, a slide plate horizontally movable on said support rail, and a rod affixed to said slide plate, said suction plate supporting head being vertically movably supported on said rod.

9. Apparatus according to claim 1 wherein each tubular magazine has a square cross-section.

10. Apparatus according to claim 1 wherein said tubular magazine includes a plug member slidable in the magazine and supporting the stack of a plurality of circuit elements.

11. Apparatus according to claim 10 wherein the plug member includes a platform portion supporting the stack of a plurality of circuit elements and an engaging portion adapted to be contacted by the inner surface of the hollow tubular magazine to prevent the plug member from falling.

12. Apparatus according to claim 11, wherein one of said tubular magazine and the magazine guide lower plate has an engaging recess and the other has means for engaging said recess for removal of support of said magazine on said lower plate.

13. Apparatus according to claim 1, further comprising applying means for applying a plurality of layers of an adhesive material on the upper surface of the printed circuit board to predetermined positions, said applying means including a vessel adapted to contain adhesive material and having through-holes formed at positions corresponding to the circuit element mounting positions on the printed circuit board, a plurality of vertically movable pins extending through said through-holes of the vessel so that when said pins are lowered, said pins contact said circuit board and occupy the through-holes and when said pins are raised up, the through-holes are opened, and a movable plate for supporting said vertically moving pins.

14. An apparatus according to claim 13 wherein the adhesive material comprises 100 parts by volume of an epoxy resin and 50 to 80 parts by volume of an acrylic acid ester resin in the co-dissolved state.

15. An apparatus according to claim 1 wherein said printed circuit board support means includes a printed circuit board guide means, a printed circuit board transfer means supported on said guide means and a printed circuit board-magazine means for holding a stack of a plurality of printed circuit boards, said magazine means being situated adjacent to one end of said printed circuit board transfer means.

* * * * *